(12) United States Patent
Hong

(10) Patent No.: US 7,635,624 B2
(45) Date of Patent: Dec. 22, 2009

(54) DUAL GATE STRUCTURE FOR IMAGERS AND METHOD OF FORMATION

(75) Inventor: Sungkwon C. Hong, Boise, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 208 days.

(21) Appl. No.: 11/273,391

(22) Filed: Nov. 15, 2005

(65) Prior Publication Data
US 2006/0060904 A1    Mar. 23, 2006

Related U.S. Application Data

(62) Division of application No. 10/714,670, filed on Nov. 18, 2003, now Pat. No. 7,164,161.

(51) Int. Cl.
*H01L 21/6242* (2006.01)
(52) U.S. Cl. .................. 438/241; 438/250; 257/298
(58) Field of Classification Search .................. 438/69, 438/250, 393; 257/300, 250, 298
See application file for complete search history.

(56) References Cited

U.S. PATENT DOCUMENTS

| | | | |
|---|---|---|---|
| 5,142,438 A | | 8/1992 | Reinberg et al. |
| 5,618,749 A | * | 4/1997 | Takahashi et al. ........... 438/384 |
| 5,631,188 A | * | 5/1997 | Chang et al. ................. 438/253 |
| 5,973,952 A | | 10/1999 | Crafts |
| 6,096,600 A | * | 8/2000 | Azami ......................... 438/250 |
| 6,124,607 A | | 9/2000 | Sandhu et al. |
| 6,171,901 B1 | * | 1/2001 | Blair et al. .................. 438/250 |
| 6,376,868 B1 | * | 4/2002 | Rhodes ........................ 257/215 |
| 6,429,068 B1 | | 8/2002 | Divakaruni et al. |
| 6,458,646 B1 | | 10/2002 | Divakaruni et al. |
| 2001/0012225 A1 | * | 8/2001 | Rhodes ........................ 365/200 |

* cited by examiner

*Primary Examiner*—Thinh T Nguyen
(74) *Attorney, Agent, or Firm*—Dickstein Shapiro LLP

(57) ABSTRACT

A device, as in an integrated circuit, includes diverse components such as transistors and capacitors. After conductive layers for all types of components are produced, a silicide layer is provided over conductive layers, reducing resistance. The device can be an imager in which pixels in an array includes a capacitor and readout circuitry with NMOS transistors. Periphery circuitry around the array can include PMOS transistors. Because the silicide layer is formed after the conductive layers, it is not exposed to high temperatures and, therefore, migration and cross-contamination of dopants is reduced.

17 Claims, 10 Drawing Sheets

DUAL GATE STRUCTURE FOR IMAGERS AND METHOD OF FORMATION

CROSS REFERENCE TO RELATED APPLICATIONS

The present application is a divisional of U.S. application Ser. No. 10/714,670, filed Nov. 18, 2003 now U.S. Pat. No. 7,164,161, the disclosure of which is herewith incorporated by reference in its entirety.

FIELD OF THE INVENTION

The invention relates to gate structures for solid state imaging devices, including CMOS and CCD imaging devices.

BACKGROUND OF THE INVENTION

In CCD, CMOS and other types of imagers, field effect transistors such as MOSFETs are employed as part of logic circuitry and DRAM cell region (memory cell region). Conventionally, MOSFETs are fabricated by placing an undoped polycrystalline material, for example polysilicon, over a relatively thin gate oxide, and implanting the polycrystalline material and adjacent active regions with an impurity dopant material to form source and drain regions. If the impurity dopant material for forming the source/drain regions is n-type, then the resulting MOSFET is an NMOSFET ("NMOS") device. Conversely, if the impurity dopant material for forming the source/drain regions is p-type, then the resulting MOSFET is a PMOSFET ("PMOS") device.

To prevent current leakage and refresh sensitivity from occurring in the source/drain region of an embedded DRAM, the resistance of the polysilicon gate has to be reduced. This reduction in the resistance of the polysilicon gate is typically achieved by forming a silicide layer, such as a tungsten silicide layer, on the polysilicon gate to improve the conductivity of the gate. Although the formation of a silicide layer on the polysilicon gate is highly desirable for embedded DRAMs, the silicide layers pose some drawbacks that need to be overcome.

To better illustrate the drawbacks as a result of silicide formation for reducing the resistance of the polysilicon gate, reference is now made to FIG. 1, which is a schematic cross-sectional view of an embedded DRAM having a memory cell region 20a formed in memory region A of the substrate 10, and a logic circuitry 20b formed in logic region B of the substrate 10.

The structures of FIG. 1 are formed by providing a gate oxide layer 12 and an undoped polysilicon layer on the substrate 10. Subsequent to the formation of undoped polysilicon layer, P-type and N-type ions are respectively implanted into the undoped polysilicon layer by using an implanting mask to form a doped polysilicon layer 13. A silicide layer 14, for example a tungsten silicide layer 14, is formed on the doped polysilicon layer 13 to improve the conductivity of the gate formed in subsequent processes. The tungsten silicide layer 14, doped polysilicon layer 13 and gate oxide layer 12 are patterned to form dual gate structures 16a, 16b each having respective N+ polysilicon layer 13a and P+ polysilicon layer 13b. Spacers 15 are formed on the sidewalls of the dual gate structure 16a and 16b. The substrate 10 underneath the dual gate structure 16a and gate structure 16b has source/drain regions 17a, 17b formed therein. The source/drain regions 17a, 17b are formed by implanting ions into the substrate 10. Ions in the source/drain regions 17a, 17b need to be activated thermally or by rapid thermal process (RTP).

As noted above, the formation of the tungsten silicide 14 is desirable as it increases the conductivity of the polysilicon layer 13a, 13b. In some IC circuit, NMOS and PMOS are directly connected to each other. However, due to the high backend thermal budget and because the diffusion coefficient of impurities in the tungsten silicide layer 14 is much larger than that in the polysilicon layer 13a, 13b, N-type ions (typically phosphorus) in the polysilicon layer 13a of the dual gate 16a diffuse into the P-type polysilicon layer 13b. Similarly, P-type ions (typically boron) in the polysilicon layer 13b of the dual gate 16b diffuse into the N-type polysilicon layer 13a. Therefore, interdiffusion 19 as seen in FIG. 1 is caused between the polysilicon layers 13a, 13b of the dual gate. In addition, P-type ions (typically boron) in the polysilicon layer 13b also diffuse into the semiconductor substrate 10 (typically silicon). This migration of impurity boron/phosphorus atoms at the source/drain interface and the diffusion of boron atoms into the silicon substrate decreases the "refresh time" of the DRAM device, and consequently increases the DRAM error rate. The "refresh time" of a DRAM cell is defined as the length of time over which the DRAM cell can retain a sufficient amount of charge for its intended data state to be determined by a sense amplifier circuit. Before this period of time expires, the DRAM cell must be reprogrammed or "refreshed" and, consequently, it is desirable that the refresh time between the refresh operations be as long as possible.

The above-noted migration and cross-contamination of impurity boron/phosphorus atoms is further exacerbated by the high temperature processes for the formation of capacitors which are employed in conjunction with other device components for charge storage and/or in analog signal processing circuits. In some IC designs, the formation of these capacitors requires deposition of another layer of polysilicon (employed as capacitor electrode layer) subsequent to the formation of the silicide layer described above. The subsequent formation of this polysilicon layer typically requires a high temperature process of about 750° C. to about 800° C. As a result of these high temperature requirements for the capacitor formation, the P-type ions (typically boron) further diffuse into the silicon substrate and from the P-type polysilicon layer 13b into the N-type polysilicon layer 13a, which in turn makes the N-type polysilicon layer 13a more like the P-type polysilicon layer 13b.

The above-noted migration and cross-contamination are further encountered when designing various integrated circuits that include diverse components such as transistors and capacitors. For example, an imager IC may include an array of pixels, each including a capacitive elements that stores photogenerated charge and readout circuitry to provide a readout signal indicating the level of stored charge. The readout circuitry typically includes several transistors, and the imager IC may also have peripheral circuitry that also includes capacitive elements and transistors. Each component, whether a capacitor or a transistor, may include one or more conductive layers and a silicide layer formed over the conductive layer, to reduce resistance.

Accordingly, there is a need for an improved method for preventing the migration of impurity atoms into the active regions of a DRAM device, as well as a method for increasing the refresh time and reducing the error rate of such DRAM devices. There is also a need for the formation of a silicide layer that would prevent the occurrence of the above-mentioned problems. An optimized process for the formation of improved imagers and imaging devices having array and periphery area transistors and capacitors with improved characteristics is also needed.

SUMMARY OF THE INVENTION

The present invention provides devices, integrated circuits and diverse components in which silicide layers reduce the resistance of conductive layers. In exemplary embodiments, imaging devices include array gate structures and capacitors and peripheral gate structures, at least one of these structures including a silicide layer. The invention also provides methods of forming a silicide region for such gate structures subsequent to the formation of capacitor structures.

These and other features and advantages of the invention will be more apparent from the following detailed description that is provided in connection with the accompanying drawings and illustrated exemplary embodiments of the invention.

DETAILED DESCRIPTION OF THE INVENTION

In the following detailed description, reference is made to various specific embodiments in which the invention may be practiced. These embodiments are described with sufficient detail to enable those skilled in the art to practice the invention, and it is to be understood that other embodiments may be employed, and that structural and logical changes may be made without departing from the spirit or scope of the present invention.

The terms "substrate" and "wafer" can be used interchangeably in the following description and may include any semiconductor-based structure or insulating structure on or at the surface if which circuitry may be formed. The structure should be understood to include silicon, silicon-on insulator (SOI), silicon-on-sapphire (SOS), doped and undoped semiconductors, epitaxial layers of silicon supported by a base semiconductor foundation, and other semiconductor and insulating structures. The semiconductor need not be silicon-based. The semiconductor could be silicon-germanium, germanium, or gallium arsenide. When reference is made to the substrate in the following description, previous process steps may have been utilized to form regions or junctions in or over the base semiconductor or foundation.

The term "pixel" refers to a discrete picture element unit cell containing a photodetector and transistors or other components for converting electromagnetic radiation to an electrical signal. For purposes of illustration, a representative pixel according to one embodiment of the invention is illustrated in the figures and description herein. An array or combination of pixels together may comprise a photodetector array for use in a CMOS or CCD imager device. Typically, fabrication of all pixels of a photodetector array will proceed simultaneously in a similar fashion.

Figure 14:
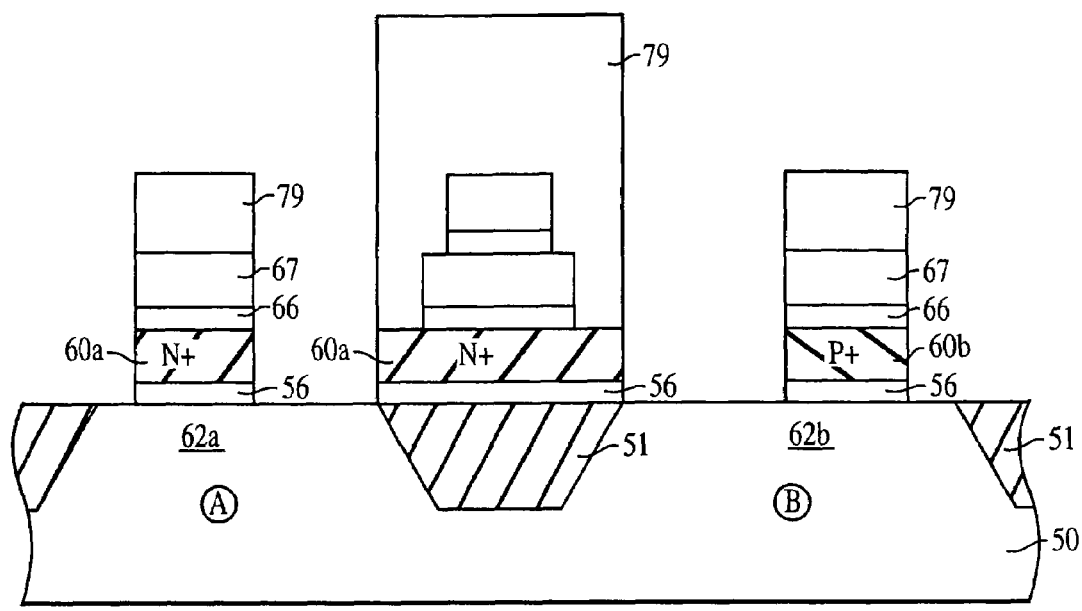
FIG. 14 is a schematic cross-sectional view of the structure of FIG. 2 at a stage of processing subsequent to that shown in FIG. 13.
Figure 15:
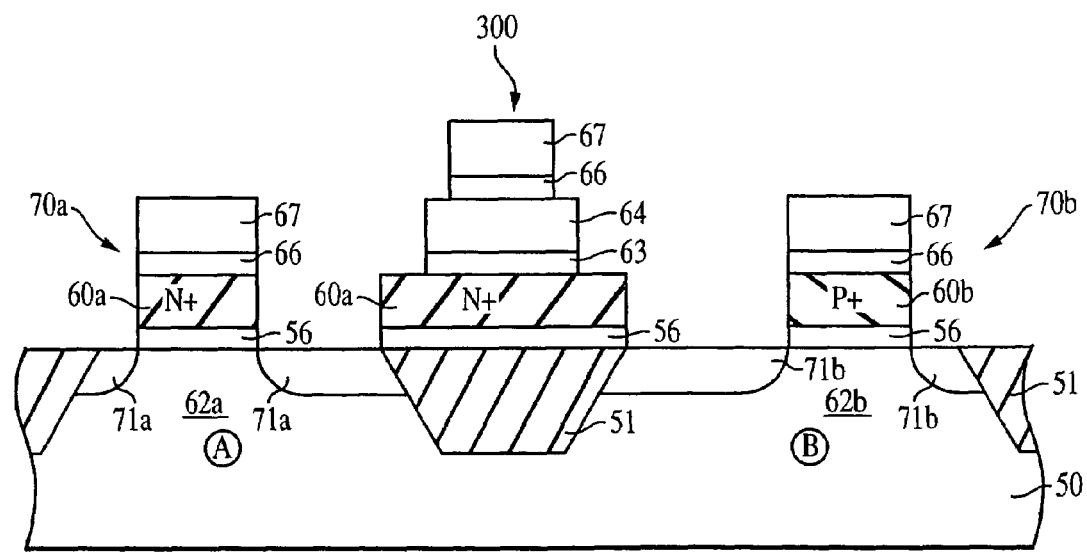
FIG. 15 is a schematic cross-sectional view of the structure of FIG. 2 at a stage of processing subsequent to that shown in FIG. 14.
Figure 16:
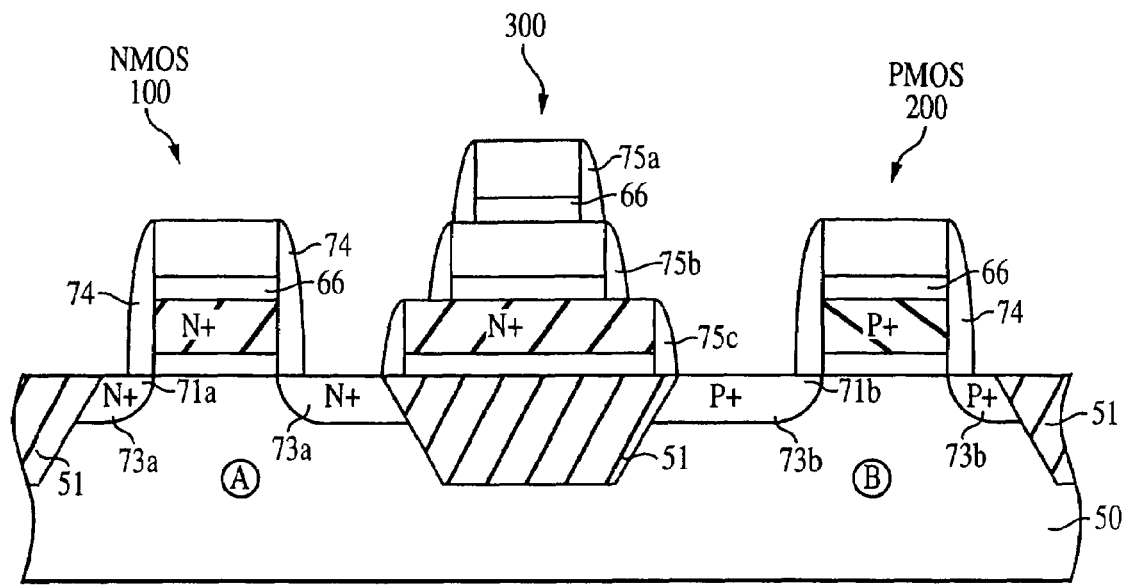
FIG. 16 is a schematic cross-sectional view of the structure of FIG. 2 at a stage of processing subsequent to that shown in FIG. 15.
Figure 17:
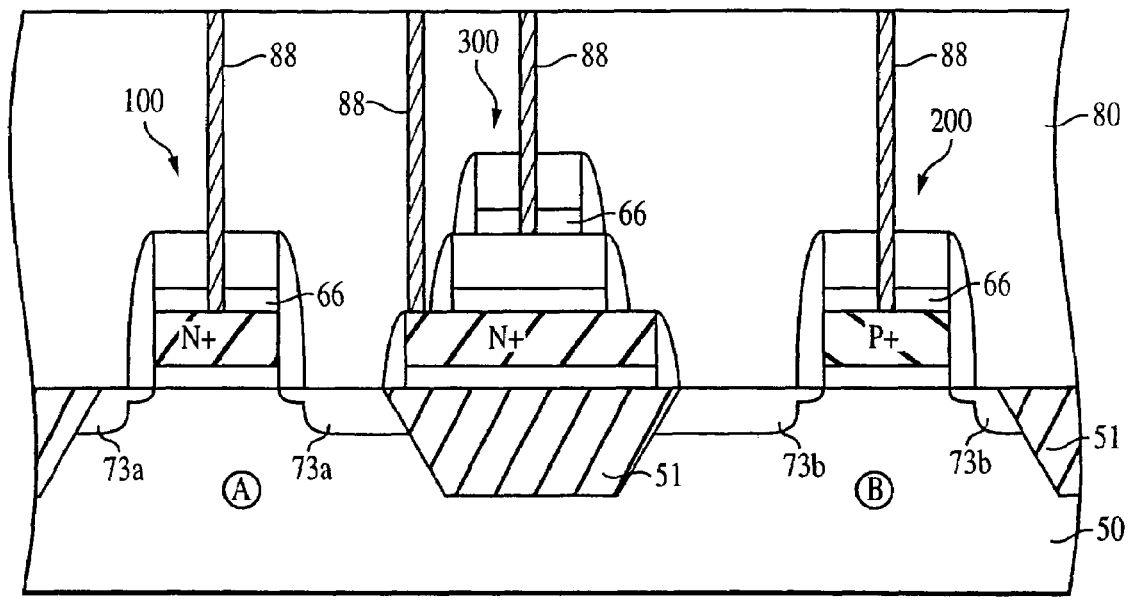
FIG. 17 is a schematic cross-sectional view of the structure of FIG. 2 at a stage of processing subsequent to that shown in FIG. 16.

Referring now to the drawings, where like elements are designated by like reference numerals, FIGS. 2-17 illustrate a method for the fabrication of an integrated circuit that includes an NMOSFET 100 (FIGS. 16-17), a PMOSFET 200 (FIGS. 16-17) and a capacitor structure 300 (FIGS. 15-17). The NMOSFET 100 and PMOSFET 200 have respective gate structures that include a silicide region 66 (FIGS. 10-17) formed subsequent to the formation of capacitor structure 300 (FIGS. 15-17), which also includes a silicide region 66. As described in detail below, the NMOSFET 100 (FIGS. 16-17) and the PMOSFET 200 (FIGS. 16-17) comprising silicide region 66 (FIGS. 10-17) formed according to embodiments of the present invention have decreased migration and cross-contamination of impurity atoms in their respective gate structures. The decreased migration and cross-contamination of impurity atoms is achieved by forming layers in a sequence such that silicide region 66 is not subjected to high temperatures.

Although the present invention will be described below with reference to the formation of an NMOS transistor and a PMOS transistor each in their respective array and periphery regions of a CMOS imager IC, such as the NMOSFET 100 (FIGS. 16-17) and the PMOSFET 200 (FIGS. 16-17), it must be understood that the invention is not limited to this embodiment. Accordingly, the invention also contemplates the formation of PMOS transistors in both the array and periphery regions of a CMOS imager IC or other IC, the formation of NMOS transistors in both the array and periphery regions of a CMOS imager IC or other IC, as well as the formation of a plurality of MOS transistors of the same or different conductivity type. In addition, although the NMOSFET 100 (FIGS. 16-17) and the PMOSFET 200 (FIGS. 16-17) are illustrated as being adjacent in the drawings, in actual practice this will likely not occur, as NMOSFET 100 is formed in an array area of a CMOS imager IC and PMOSFET 200 is formed in a peripheral area outside the array area. Thus, the below illustrated and described embodiments are only exemplary, and the present invention is not limited to the illustrated embodiments.

Figure 1:
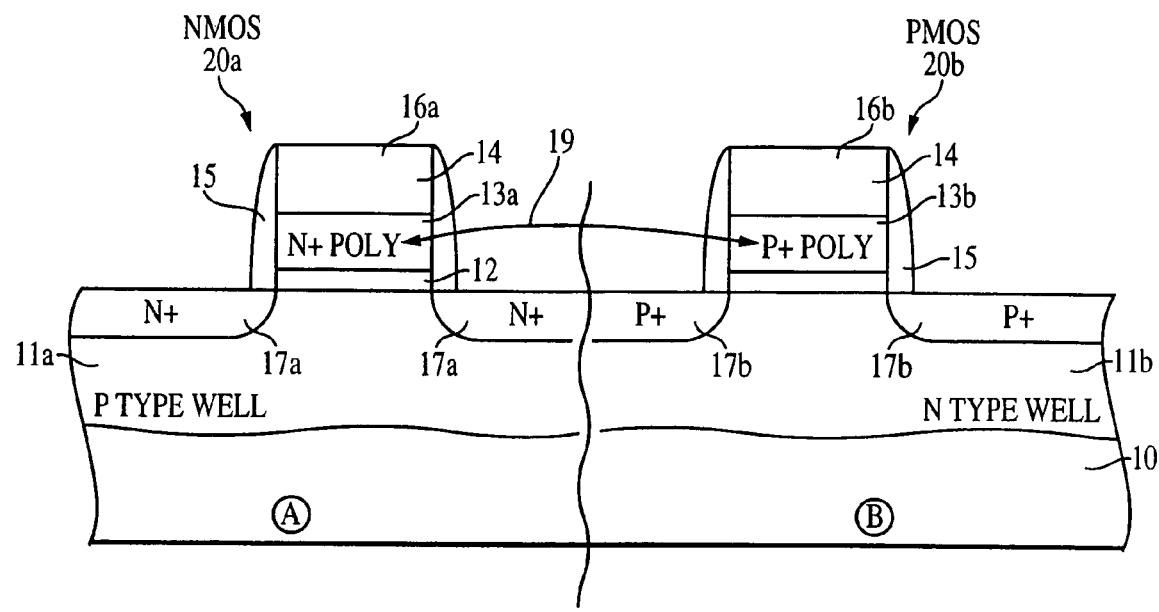
FIG. 1 is a schematic cross-sectional view of an embedded DRAM as known in the art.
Figure 2:
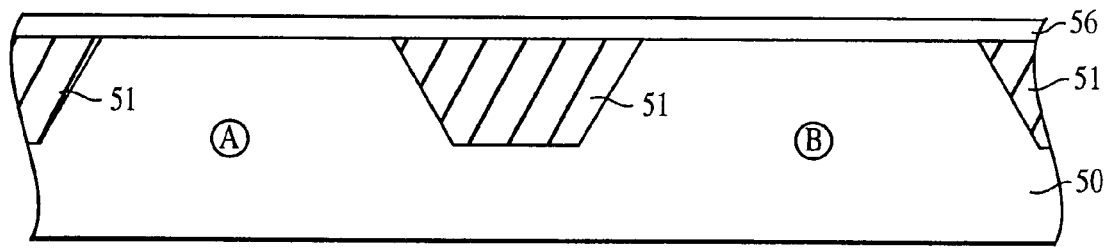
FIG. 2 is a schematic cross-sectional view of a dual gate structure formed according to an exemplary embodiment of the invention and at an initial stage of processing.

FIG. 2 illustrates a semiconductor substrate base 50, for example, a doped silicon substrate 50 having an active dopant concentration within the range of about $1\times10^{16}$ to $1\times10^{18}$ atoms per $cm^3$, more preferably about $5\times10^{16}$ to $5\times10^{17}$ atoms per $cm^3$. As also shown in FIG. 2, isolation regions 51 are formed in the substrate 50 by any known technique, such as thermal oxidation of the underlying silicon in a LOCOS process, or by etching trenches and filling them with a dielectric or an oxide material in an STI process. This way, the isolation regions 51 (FIG. 2) may be field oxide regions (FOX) or shallow trenches for isolation (STI).

According to an exemplary embodiment of the present invention, isolation regions 51 (FIG. 2) are shallow trenches for isolation filled with high density plasma (HDP) oxide, a material which has a high ability to effectively fill narrow trenches. Alternatively, an insulating layer (not shown) formed of an oxide or of silicon nitride, for example, may be formed on the trench sidewalls, prior to filling the trench with the isolation dielectric, to aid in smoothing out the corners in the bottom of the trench and to reduce the amount of stress in the dielectric used to later fill in the trench.

As known in the art, isolation regions 51 provide electrical and physical separation, as well as isolation between neighboring transistor regions on the semiconductor substrate 50. As illustrated in FIG. 2, the middle isolation region 51 isolates region A of the semiconductor substrate 50 on which array circuitry will be subsequently formed, from region B of the semiconductor substrate 50 on which peripheral circuitry will be subsequently formed, all according to embodiments of the present invention.

Subsequent to the formation of isolation regions 51 (FIG. 2), a thin gate oxide layer 56, which will act as a gate insulator layer, is formed over the semiconductor substrate 50, as also illustrated in FIG. 2. The thin gate oxide layer 56 may comprise silicon dioxide ($SiO_2$), for example, which may be thermally grown in an oxygen ambient, at a temperature between about 600° C. to about 1000° C. and to a thickness of about 10 Angstroms to about 100 Angstroms. The gate insulator is not limited to silicon oxide and other dielectric materials such as oxynitride, $Al_2O_3$, $Ta_2O_5$ or other high k material may be used as gate insulator layer.

Figure 3:
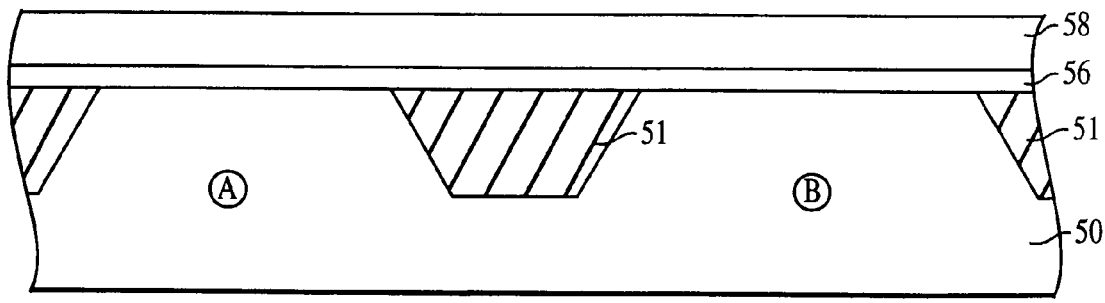
FIG. 3 is a schematic cross-sectional view of the structure of FIG. 2 at a stage of processing subsequent to that shown in FIG. 2.

As illustrated in FIG. 3, an undoped gate layer 58 is formed over the thin gate oxide layer 56. According to an embodiment of the present invention, the undoped gate layer 58 is formed of polysilicon which may be deposited over the thin gate oxide layer 56 by, for example, a low plasma chemical vapor deposition (LPCVD) method at a temperature of about 300° C. to about 700° C. and to a thickness of about 100 Angstroms to about 2,000 Angstroms.

According to another embodiment of the present invention, the undoped gate layer 58 is a layer of silicon/germanium (Si/Ge) material. According to this embodiment, the gate silicon/germanium layer is grown by a low plasma chemical vapor deposition (LPCVD) method in a reaction chamber at a temperature of about 900° C. to about 1200° C., and by employing a silicon (Si) and germanium (Ge) gas source to introduce a gaseous species containing silicon and germanium in the same reaction chamber. For example, the silicon gas source may be, for example, silane ($SiH_4$), higher order silanes, such as disilane ($Si_2H_6$), as well as other gaseous sources of silicon, such as dichlorsilane ($SiH_2Cl_2$), trichlorsilane ($SiHCl_3$), or tetrachlorsilane ($SiCl_4$). The germanium gas source may be, for example, a germane ($GeH_4$) source, or any other gaseous source containing germanium. The combination of the two gaseous sources allows deposition of the gate silicon/germanium layer to a thickness of about 100 Angstroms to about 1500 Angstroms, more preferably of about 500 Angstroms to about 900 Angstroms. Although, as described above, the undoped gate layer 58 may be formed of various semiconductor materials, reference to the undoped gate layer 58 will be made in this application as to the undoped polysilicon layer 58.

Figure 4:
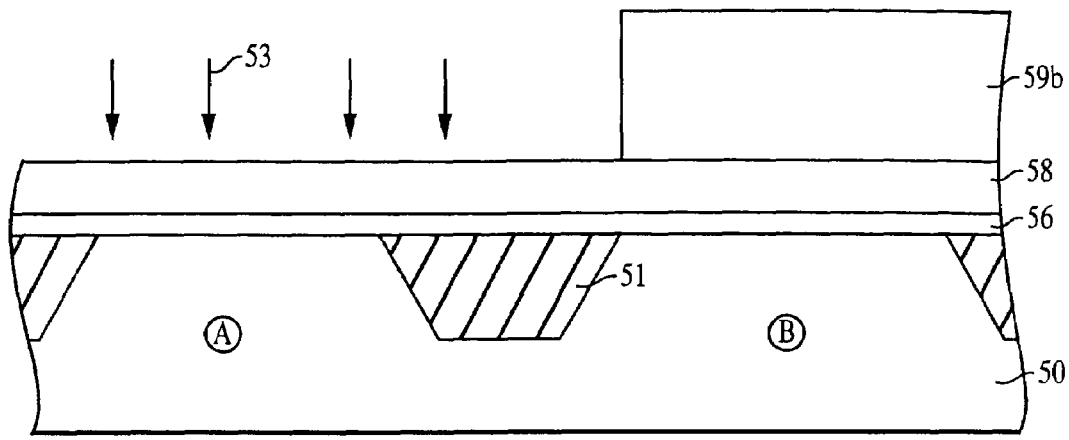
FIG. 4 is a schematic cross-sectional view of the structure of FIG. 2 at a stage of processing subsequent to that shown in FIG. 3.

Subsequent to the formation of the undoped polysilicon layer 58 (FIG. 3), a first patterned photoresist layer 59b (FIG. 4) is formed to a thickness of about 1,000 Angstroms to about 10,000 Angstroms over the undoped polysilicon layer 58 and over the region B, but not over the region A on which an array of pixel cells or other cells with capacitive components and transistors will be subsequently formed. As shown in FIG. 4, the first patterned photoresist layer 59b is also not formed over the middle STI region 51, over which capacitor structure 300 (FIGS. 15-17) will be formed according to embodiments of the present invention. Thus using the thick patterned photoresist layer 59b as a mask, dopant or impurity atoms of a first conductivity type are introduced into the exposed portion of the undoped polysilicon layer 58 located above the region A of the substrate 50 and above the middle STI region 51 by using a first ion implantation 53 (FIG. 4) to form a doped polysilicon layer 60a, illustrated in FIG. 5.

Figure 5:
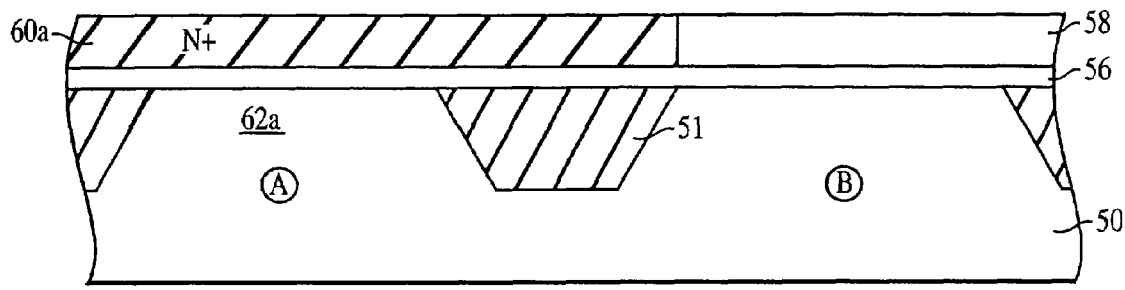
FIG. 5 is a schematic cross-sectional view of the structure of FIG. 2 at a stage of processing subsequent to that shown in FIG. 4.

According to an exemplary embodiment of the invention, the dopant or impurity atoms of the first conductivity type are of n-type conductivity for NMOS device fabrication. Thus, n-type dopants such as phosphorous (P), arsenic (As) or antimony (Sb) are implanted into the exposed region of the undoped polysilicon layer 58 by using the first ion implantation 53 (FIG. 4) to form the n+ doped polysilicon layer 60a (FIG. 5). Ion implantation is performed by placing the substrate 50 in an ion implanter, for example, and implanting appropriate dopant ions into the exposed portion of the undoped polysilicon layer 58. For example, phosphorous is introduced into the exposed portion of the undoped polysilicon layer 58 of FIG. 4 using ion implantation at an accelerated energy of about 1 keV to about 50 keV and a dose concentration of about $1\times10^{15}/cm^2$ to about $5\times10^{15}/cm^2$. A heat treatment such as an anneal treatment at about 600° C. to about 1000° C., may be optionally employed to activate the dopant within the n+ doped polysilicon layer 60a of FIG. 5.

Subsequent to the formation of the n+ polysilicon layer 60a of FIG. 5, the substrate 50 may optionally undergo another ion implantation using the first patterned photoresist layer

59b as a mask (or another photoresist layer as a mask), this time with dopant impurity ions of a second conductivity type. In this manner, p-type dopant impurity ions, such as boron (B), boron fluoride (BF$_2$) or indium (In) are implanted into the substrate 50 to form a p-type well 62a as shown in FIG. 5. Ion implantation is performed by placing the substrate 50 in an ion implanter, for example, and implanting appropriate p-type dopant ions into region A of the substrate 50. For example, boron is introduced into region A using ion implantation at an accelerated energy of about 15 keV to about 150 keV and a dose concentration of about $1 \times 10^{11}/cm^2$ to about $5 \times 10^{13}/cm^2$. A heat treatment, for example, an anneal treatment at about 600° C. to about 1000° C., may be optionally employed to activate the dopant within the doped p-type well 62a of FIG. 5.

Although the invention has been described above with reference to the formation of the p well 62a (FIG. 5) subsequent to the formation of the n+ polysilicon layer 60a (FIG. 5), the invention is not limited to this exemplary embodiment. As such, the invention also contemplates the formation of the p well 62a first, and then followed by the formation of the n+ polysilicon layer 60a.

Figure 6:
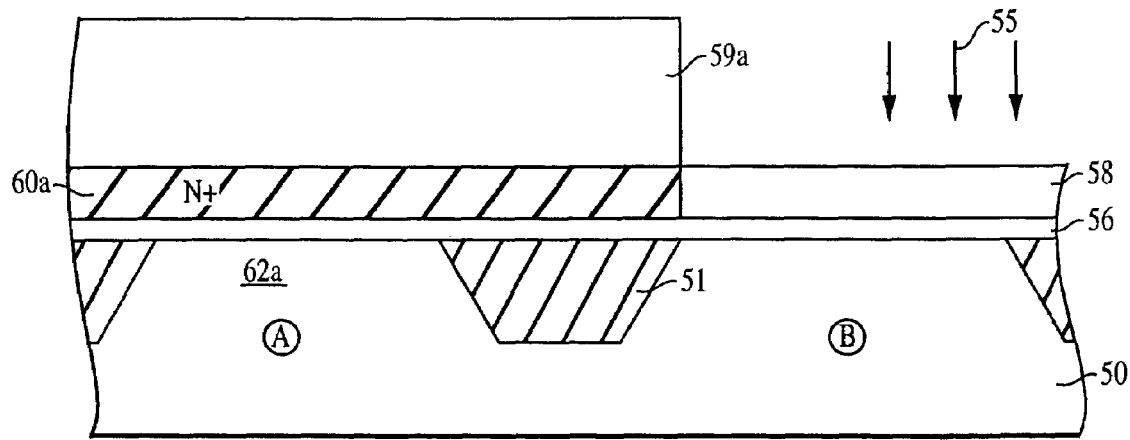
FIG. 6 is a schematic cross-sectional view of the structure of FIG. 2 at a stage of processing subsequent to that shown in FIG. 5.

Referring now to FIG. 6, a second patterned photoresist layer 59a is formed to a thickness of about 1,000 Angstroms to about 10,000 Angstroms over the n+ doped polysilicon layer 60a and the p doped well 62a, but not over the region B on which periphery circuitry will be subsequently formed according to a method of the present invention. As also illustrated in FIG. 6, the second patterned photoresist layer 59a is also formed over the middle STI region 51. Accordingly, using the thick patterned photoresist layer 59a as a mask, dopant or impurity atoms of the second conductivity type are introduced into the exposed portion of the undoped polysilicon layer 58 located above the region B of the substrate 50 to form a p+ doped polysilicon layer 60b, as illustrated in FIG. 7.

Figure 7:
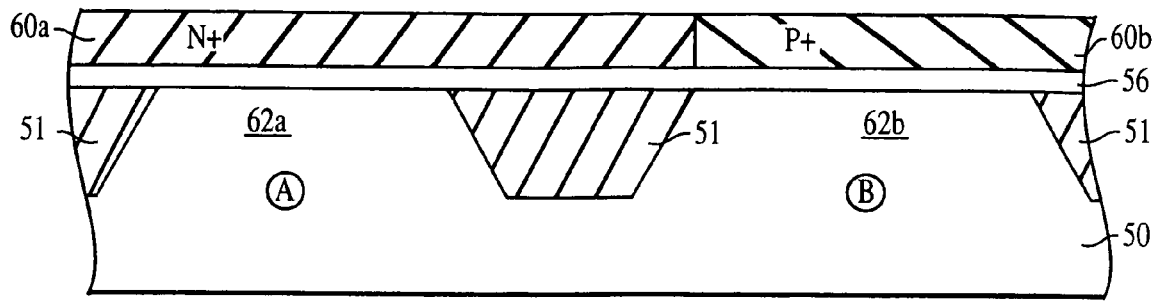
FIG. 7 is a schematic cross-sectional view of the structure of FIG. 2 at a stage of processing subsequent to that shown in FIG. 6.

P-type dopant impurity ions, such as boron (B), boron fluoride (BF$_2$) or indium (In) are implanted into the exposed region of the undoped polysilicon layer 58 of FIG. 6 by using a second ion implantation 55 (FIG. 6) to form the p+ doped polysilicon layer 60b (FIG. 7). Ion implantation is performed by placing the substrate 50 in an ion implanter, and implanting appropriate dopant ions into the exposed portion of the undoped polysilicon layer 58. For example, boron is introduced into the exposed portion of the undoped polysilicon layer 58 of FIG. 6 using ion implantation at an accelerated energy of about 1 keV to about 50 keV and a dose concentration of about $1 \times 10^{15}/cm^2$ to about $5 \times 10^{15}/cm^2$. A heat treatment, for example, an anneal treatment at about 600° C. to about 1000° C., may be optionally employed to activate the dopant within the p+ doped polysilicon layer 60b of FIG. 7.

According to an embodiment of the invention and subsequent to the formation of the p+ polysilicon layer 60b of FIG. 7, the substrate 50 may optionally undergo another ion implantation to form a lightly doped or very lightly doped n-type well 62b illustrated in FIG. 7. For this, n-type dopants such as phosphorous (P), arsenic (As) or antimony (Sb) are implanted into the region B of the substrate 50 to form the n-type well 62b. Although the invention has been described above with reference to the formation of the n-type well 62b (FIG. 7) subsequent to the formation of the p+ polysilicon layer 60b (FIG. 7), the invention is not limited to this exemplary embodiment. As such, the invention also contemplates the formation of the n-type well 62b first, and then followed by the formation of the p+ polysilicon layer 60b. The invention could also be embodied in structures without a well.

Figure 8:
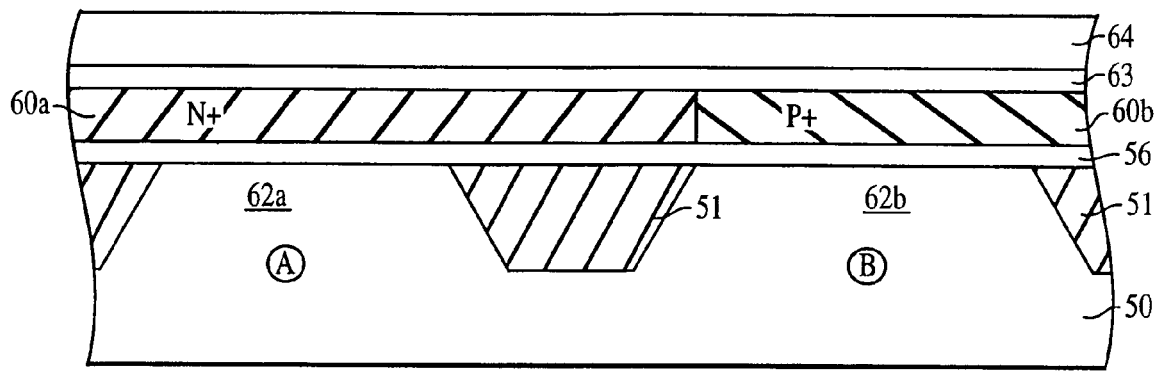
FIG. 8 is a schematic cross-sectional view of the structure of FIG. 2 at a stage of processing subsequent to that shown in FIG. 7.

Referring now to FIG. 8 and in accordance with an exemplary embodiment of the present invention, a dielectric layer 63 is formed over the doped polysilicon layers 60a, 60b, as shown in FIG. 8. The dielectric layer 63 may be formed of an oxide, nitride, Al$_2$O$_3$, Ta$_2$O$_5$, or BST material, or any other nonconductor of direct electric current. The dielectric layer 63 may be formed by any suitable deposition technique, including chemical vapor deposition (CVD) techniques such as low pressure chemical vapor deposition (LPCVD) or high density plasma (HDP) deposition. The dielectric layer 63 may be formed to a thickness of about 10 Angstroms to about 2,000 Angstroms, and with any desired shape and geometry suitable to the dielectric of a capacitor.

Subsequent to the formation of the dielectric layer 63, a conductive layer 64 of conductive material that will eventually form a second capacitor electrode of capacitor 300 (FIGS. 15-17) is formed over the dielectric layer 63, as also shown in FIG. 8. The conductive layer 64 may be formed of any suitable electrode material, including but not limited to metals, metal alloys, conductive metal oxides or combinations of such metals, metal alloys and conductive metal oxides. The conductive layer 64 may be also formed of doped polysilicon, or conductive combinations of polysilicon and other metals and compositions, such as polysilicon/HSG (hemispherical grained polysilicon), polysilicon/WSi and polysilicon/WN/W, among others.

If the conductive layer 64 comprises doped polysilicon, then the polysilicon may be formed by deposition, for example CVD, PECVD and LPCVD, at a temperature between about 600° C. to about 800° C., to a thickness of about 500 Angstroms to about 2,000 Angstroms. The conductive layer 64 may be optionally planarized after its formation, using any suitable planarizing technique.

Figure 9:
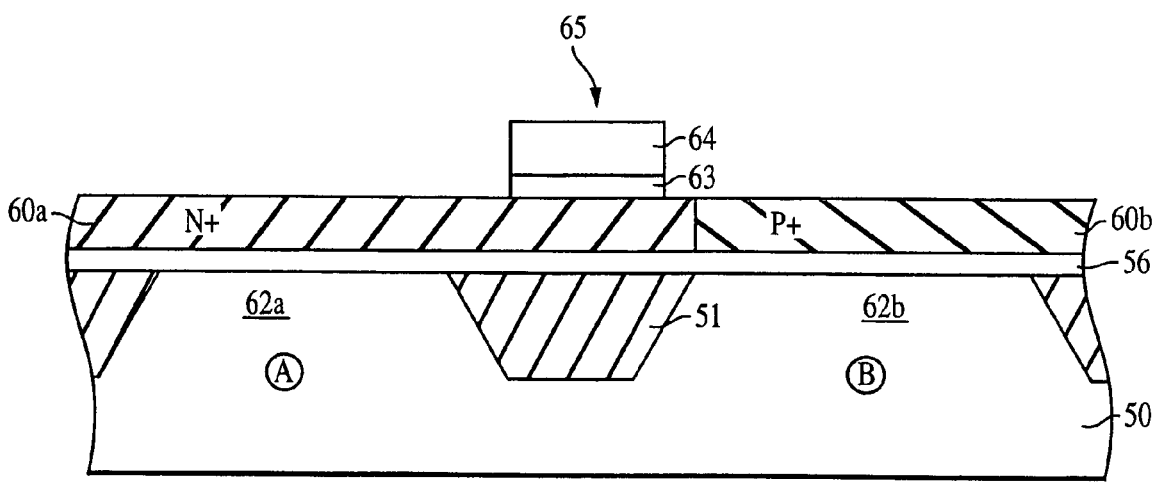
FIG. 9 is a schematic cross-sectional view of the structure of FIG. 2 at a stage of processing subsequent to that shown in FIG. 8.

Reference is now made to FIG. 9. The conductive layer 64 and the dielectric layer 63 are patterned with a photoresist layer and a mask and then anisotropically etched through the patterned photoresist, to obtain capacitor stack 65 located above the n+ polysilicon layer 60a and the middle STI region 51 of FIG. 9.

Figure 10:
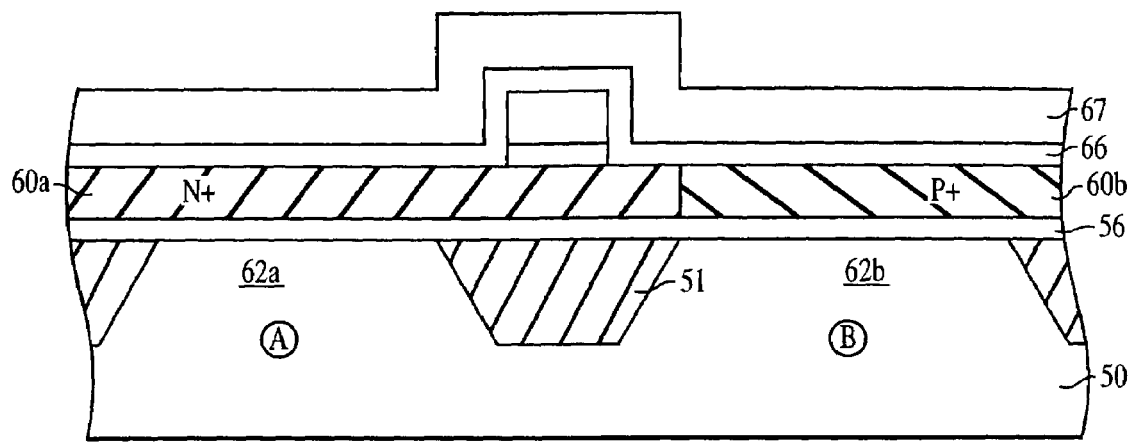
FIG. 10 is a schematic cross-sectional view of the structure of FIG. 2 at a stage of processing subsequent to that shown in FIG. 9.
Figure 11:
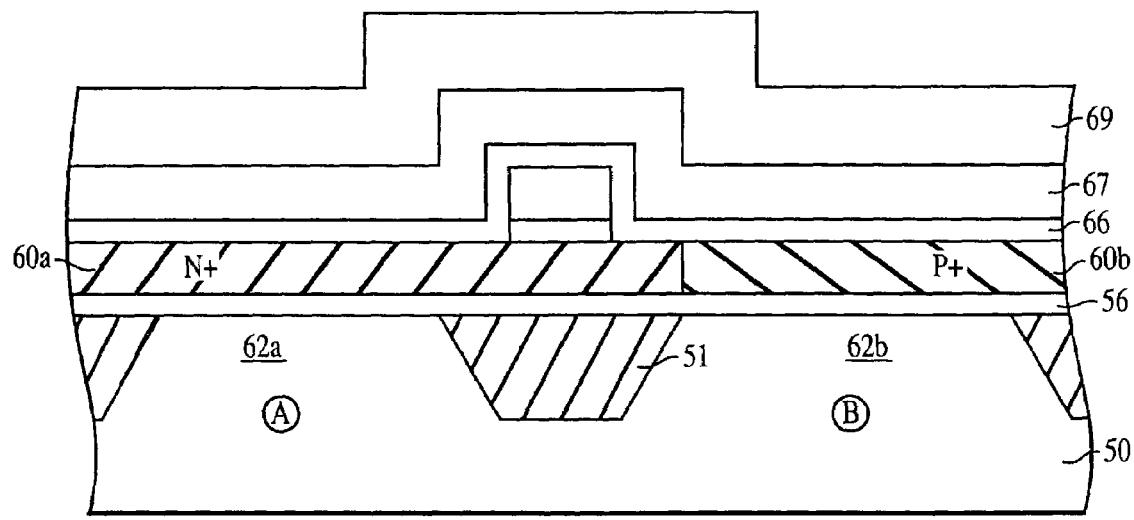
FIG. 11 is a schematic cross-sectional view of the structure of FIG. 2 at a stage of processing subsequent to that shown in FIG. 10.
Figure 12:
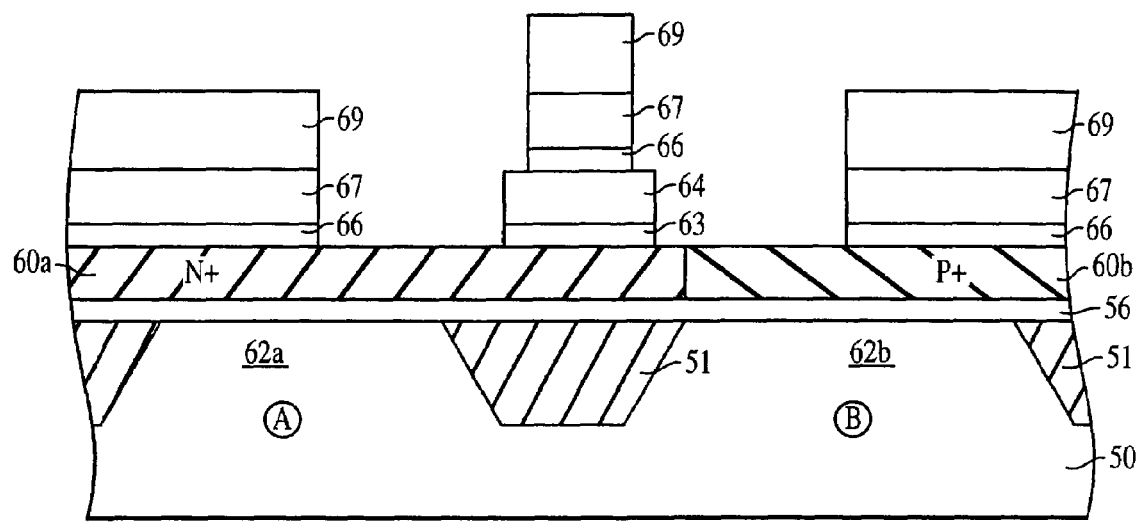
FIG. 12 is a schematic cross-sectional view of the structure of FIG. 2 at a stage of processing subsequent to that shown in FIG. 11.

Subsequent to the formation of capacitor stack 65 of FIG. 9, a silicide layer 66 and an insulating layer 67 are sequentially formed over the capacitor stack 65, the n+ polysilicon layer 60a and the p+ polysilicon layer 60b, as shown in FIG. 10. The silicide layer 66 may formed by depositing a layer of metal capable of forming a silicide, such as cobalt, nickel, molybdenum or titanium, for example, over the doped polysilicon layers 60a, 60b (FIG. 9) and over the capacitor stack 65 (FIG. 9) by sputtering by RF or DC, or by other similar methods such as CVD, to a thickness of about 100 Angstroms to about 800 Angstroms. Subsequent to the deposition of the metal capable of forming a silicide, the substrate 50 is subjected to a rapid thermal anneal (RTA), typically for about 10 to 60 seconds, using a nitrogen ambient at about 600° C. to about 850° C., so that the metal in direct contact with the doped polysilicon layers 60a, 60b and the conductive layer 64 is converted to its silicide. As shown in FIG. 16, silicide layer 66 forms conductive regions 66 on top of the doped polysilicon layers 60a, 60b. Preferably, the refractory metal has low resistance and low resistivity as a silicide. However, the refractory metal silicide may comprise any refractory metal, including but not limiting to tungsten, titanium, cobalt, tantalum, molybdenum, and platinum. The refractory metal silicide may also comprise combination of silicides doped with nitrogen, such as tungsten nitride silicide or a combination of tungsten nitride silicide/tungsten silicide, for example.

Insulating layer 67, which is preferably a cap material formed over the silicide regions 66, is also illustrated in FIG.

10. The cap material may be formed of silicon dielectrics such as silicon nitride or silicon oxide, but TEOS or carbides may be used also. This layer may be formed via PECVD and LPCVD deposition procedures, for example, at a temperature between about 300° C. to about 1000° C., to a thickness of about 500 Angstroms to about 2,000 Angstroms.

Next, the structure of FIG. 10 is patterned with a photoresist layer 69 (FIG. 11) and a mask which are both formed over the cap material 67. In this manner, the silicide layer 66 and the cap material 67, but not the doped polysilicon layers 60a, 60b, are anisotropically etched through the patterned photoresist, to obtain the structure of FIG. 12.

Figure 13:
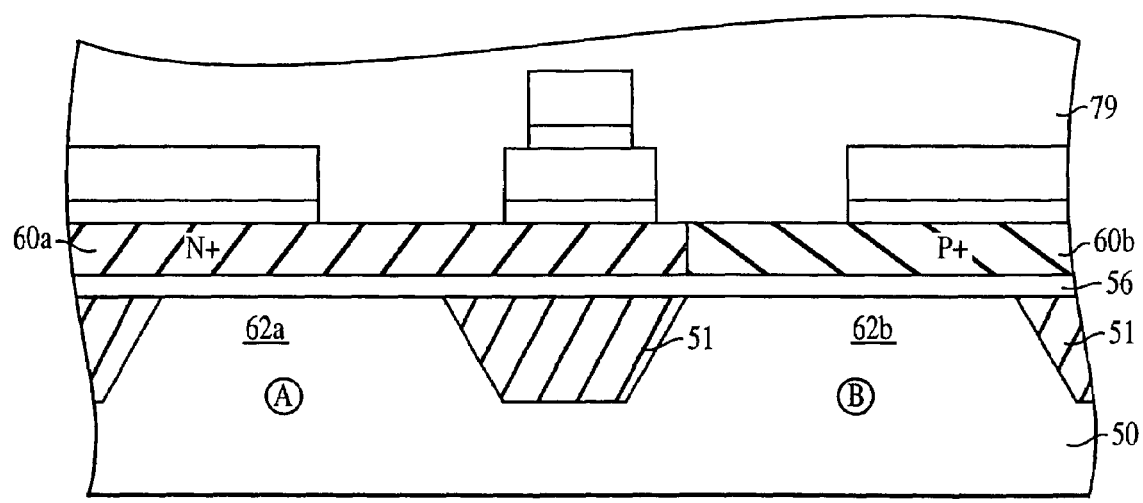
FIG. 13 is a schematic cross-sectional view of the structure of FIG. 2 at a stage of processing subsequent to that shown in FIG. 12.

Subsequent to the removal of the remaining photoresist layer 69 from atop the cap material 67, another photoresist layer 79 is formed over the cap material 67 and over the exposed portions of the conductive layer 64 and doped polysilicon layers 60a, 60b, as shown in FIG. 13. Although, for simplicity, FIG. 13 illustrates the formation of the photoresist layer 79 over the cap material 67 and over the exposed portions of the doped polysilicon layers 60a, 60b in a schematic manner, a person skilled in the art will understand that the photoresist layer 79 is conformally deposited over the structures of FIG. 12.

Subsequent to the formation of the photoresist layer 79, the structure of FIG. 13 is subjected to another photolithographic patterning and etch process to etch through the doped polysilicon layers 60a, 60b and through the thin gate oxide layer 56 to form the structure of FIG. 14. Upon removal of the remaining portion of the photoresist layer 79 from the top of the cap material 67, the resultant structures (FIG. 15) are gate stacks 70a, 70b and capacitor structure 300 formed over the semiconductor substrate 50. Each of the gate stacks 70a, 70b comprises gate oxide layer 56, one of the doped polysilicon layer 60a, 60b, the silicide region 66 and the nitride cap 67. Gate 70a comprises the n+ doped polysilicon layer 60a, while gate 70b comprises the p+ doped polysilicon layer 60b. Capacitor structure 300 comprises doped polysilicon layer 60a, which acts as a first capacitor electrode, dielectric layer 63 and conductive layer 64, which acts as a second capacitor electrode. Also shown as part of the capacitor structure 300 are silicide region 66 and nitride cap 67.

For each of the gate stacks 70a, 70b, silicide region 66 has been formed subsequent to the high temperature deposition of the conductive layer 64, which forms the second capacitor electrode 64 of capacitor 300. Thus, as the silicide region 66 is not subjected to high temperature processes, the diffusion coefficient of impurities in the silicide layer 66 is reduced and, accordingly, N-type ions (e.g., boron) in the polysilicon layer 60a of the gate 70a do not diffuse into the P-type polysilicon layer 60b. Similarly, P-type ions (e.g., phosphorus) in the polysilicon layer 60b of the gate 70b do not diffuse into the N-type polysilicon layer 60a. Therefore, no interdiffusion takes place between the polysilicon layers 60a, 60b of the gate structures. In addition, the diffusion of N-type ions (e.g., boron) of the polysilicon layer 60a into the semiconductor substrate 50 (e.g., silicon) is also decreased.

The gate stacks 70a, 70b of FIG. 15 may now be used in a self-aligned implant process where the gate stacks mask the dopant implantation of source/drain regions 73a, 73b (FIG. 16) of the adjacent transistors defined by the gate stacks. As such, FIG. 15 illustrates the formation of lightly doped drain (LDD) regions 71a, 71b in the substrate 50. As known in the art, the LDD regions 71a, 71b may be formed by implanting low dosages of conductivity-altering dopants with an LDD mask (not shown) and using the gate stacks 70a, 70b as an implantation mask. Thus, in the well 62a of the region A of the substrate 50, n-type dopants such as arsenic or phosphorous may be implanted at a low energy dose, for example of about $2 \times 10^{14}$ atoms/cm$^2$, using the gate stack 70a as a mask. Similarly, in the well 62b of the region B of the substrate 50, n-type dopants such as arsenic or phosphorous may be also implanted at a low energy dose, for example of about $2 \times 10^4$ atoms/cm$^2$, using the gate stack 70b as a mask.

The next step in the process flow is the formation of spacers 74 and 75a, 75b, 75c, all illustrated in FIG. 16. For example, spacers 74 may be formed by blanket depositing a silicon nitride film or a silicon oxide material over the structure of FIG. 15 and then anisotropically etching it with an RIE plasma to form the spacers 74 on each of the sidewalls of the gate stacks 70a, 70b.

The gate stacks 70a, 70b protected by spacers 74 can now undergo processing steps for the formation of source/drain regions in the substrate 50. As such, using the gate stacks 70a, 70b as an implantation mask, heavily doped source/drain regions 73a, 73b are formed in the uncovered portions of the substrate 50 via an ion implantation procedure performed at an energy of about 3 KeV to about 50 keV, and at a dose of about $1 \times 10^{15}$ to about $5 \times 10^{15}$ atoms/cm$^2$, using an n-type dopant such as arsenic or phosphorous, for example, and a p-type dopant such as a boron or indium, for example. Thermal annealing for activation may be carried out in a nitrogen atmosphere at about 850° C. to about 1050° C. and for about 10 seconds to about 10 minutes.

This way, source and drain regions 73a, 73b (FIG. 16), which are heavily doped with n-type and p-type impurity ions, respectively, are formed within the wells 62a, 62b. Thus, an n-p-n type (NMOS) transistor 100 (FIG. 16) and a p-n-p type (PMOS) transistor 200 (FIG. 16) are formed of the gate stacks 70a, 70b and their respective n-type source/drain region 73a and p-type source/drain region 73b within the wells 62a, 62b. NMOS transistor 100 is formed in the memory array area and PMOS transistor 200 is formed in the periphery area. Additional implants may be conducted into the substrate 50 to form a photodiode or other photoconversion devices.

Examples of the implementation of the present invention and of the characteristics of the NMOS and PMOS transistors comprising silicide regions formed subsequent to the formation of capacitor structures according to embodiments of the present invention will now be described with reference to FIGS. 17-20. The NMOS transistor 100 (FIG. 16) may be used as an access transistor in a memory device such as a random access memory device, in flash memory, SRAM memory or CMOS imagers, among others. For example, the NMOS transistor 100 (FIG. 16) may be used in a DRAM memory device formed, as known in the art, of a pair of memory cells comprising respective access NMOS transistors, at least one being NMOS transistor 100 formed according to the present invention. FIG. 17 depicts contacts 88, all formed within one or more insulating layers, such as insulating layer 80, formed over the NMOS transistor 100, the PMOS transistor 200 and the capacitor 300. Insulating layer 80 may be a layer of tetraethyl orthosilicate (TEOS) formed by conventional deposition processes, for example thermal oxidation or chemical vapor deposition (CVD). Insulating layer 80 may be optionally formed as a nitride, oxide, ON (oxide-nitride), NO (nitride-oxide), ONO (oxide-nitride-oxide), or other insulating material.

Figure 18:
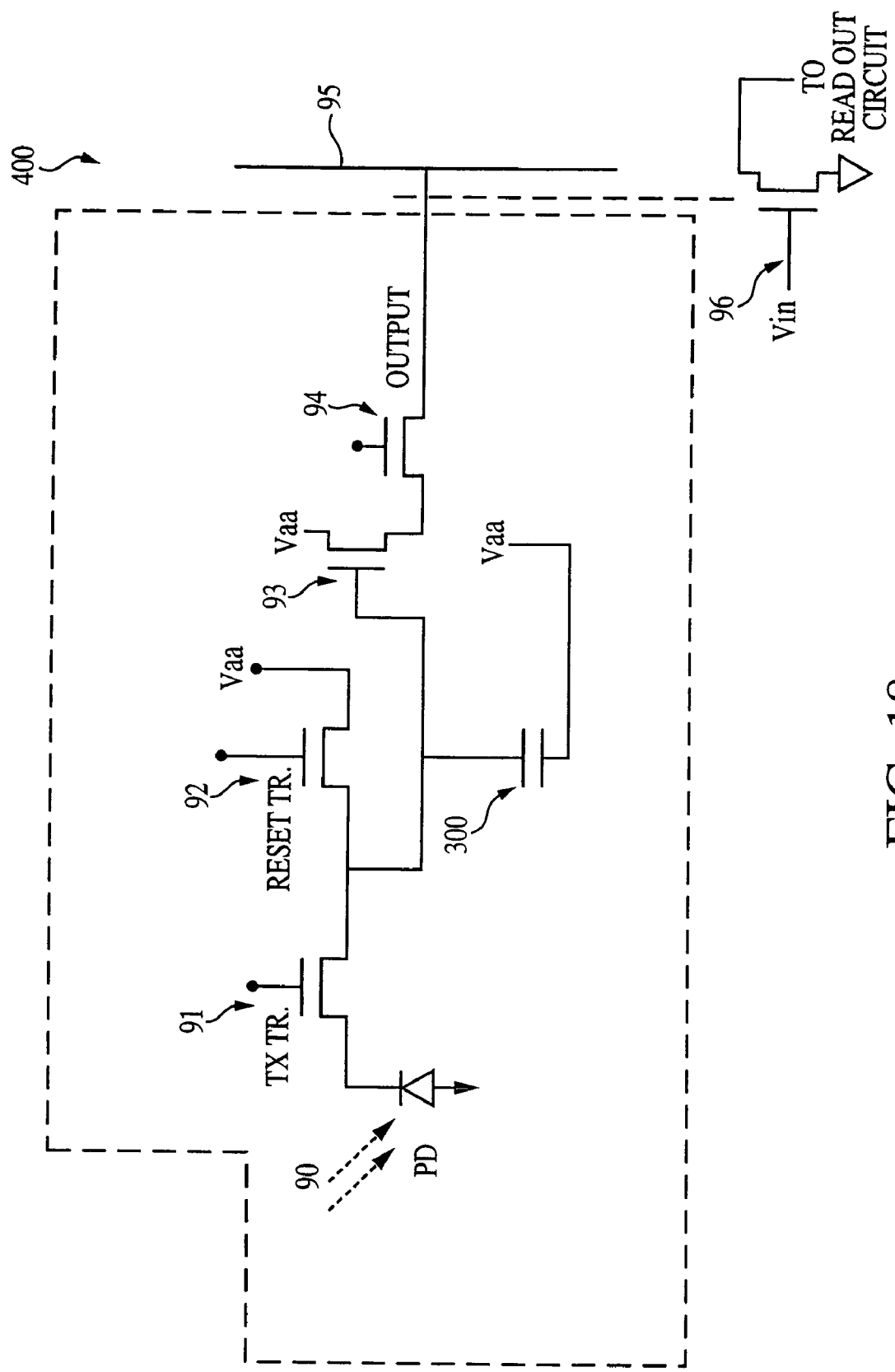
FIG. 18 is a schematic cross-view of elements of a CMOS imaging device.

The NMOS or PMOS transistor 100, 200 (FIGS. 16-17) may be employed in any integrated circuit structures, for example, as part of, or in conjunction with, various elements of a four-transistor (4T) pixel cell 400 of a CMOS imaging device, as shown schematically in FIG. 18.

FIG. 18 depicts transfer transistor 91, reset transistor 92, source follower transistor 93 and row select transistor 94 as part of the pixel cell 400. Each of these transistors can be an NMOS device, fabricated like the NMOS transistor 100 of FIG. 17. Details of the functions and attributes of the these CMOS imaging elements such as transistors 91, 92, 93 and 94 are generally known in the art and they are discussed in a multitude of references such as, for example, Nixon et al., "256×256 CMOS Active Pixel Sensor Camera-on-a-Chip," IEEE Journal of Solid-State Circuits, Vol. 31(12), pp. 2046-2050 (1996); and Mendis et al., "CMOS Active Pixel Image Sensors," IEEE Transactions on Electron Devices, Vol. 41(3), pp. 452-453 (1994), the disclosures of which are incorporated by reference herein.

As known in the art, a CMOS imager circuit includes a focal plane array of pixel cells, each one of the cells including either a photodiode, a photogate, a photodetector or a photoconductor overlying a doped region of a substrate for accumulating photo-generated charge in the underlying portion of the substrate. In a CMOS imager, the active elements of a pixel cell perform the necessary functions of: (1) photon to charge conversion; (2) accumulation of image charge; (3) transfer of charge to a floating diffusion node accompanied by charge amplification; (4) resetting the floating diffusion node to a known state before the transfer of charge to it; (5) selection of a pixel for readout; and (6) output and amplification of a signal representing pixel charge. The charge at the floating diffusion node is typically converted to a pixel output voltage by a source follower output transistor. The photosensitive element of a CMOS imager pixel is typically either a depleted p-n junction photodiode or a field induced depletion region beneath a photogate.

For example, photosensor 90 of pixel cell 400 of FIG. 18 may be formed as a photodiode for accumulating photo-generated charge in an underlying portion of the substrate 50. Photosensor 90 may include, for example, a photosensitive p-n-p junction region formed at or beneath the upper surface of substrate 50 by conventional techniques. It should be understood that the imagers of the invention may include a photogate, photoconductor, or other image to charge converting device, in lieu of a photodiode, as the initial accumulator for photo-generated charge. Photosensor 90 may be formed at or beneath the upper surface of substrate 50, and may also be constructed in any arrangement, orientation, shape and geometry, to be integrated with other components of a semiconductor device.

As also shown in FIG. 18, capacitor 300 is connected to store charge received from photosensor 90 through transfer transistor 91 in response to a pulse in a transfer (Tx) signal. Previously, capacitor 300 is reset to an uncharged state through reset transistor 92 in response to a reset signal pulse. The charge stored by capacitor 300 controls conductivity of source follower transistor 93, which provides an output signal indicating its conductivity through row select transistor 94 in response to a row select signal. The output signal is conducted by column readout line 95 out of the array of the pixel cells to peripheral readout circuitry. Load transistor 96, controlled by voltage Vin, is part of the peripheral circuitry and can be a PMOS transistor fabricated like the PMOS transistor 200 of FIG. 17.

Figure 19:
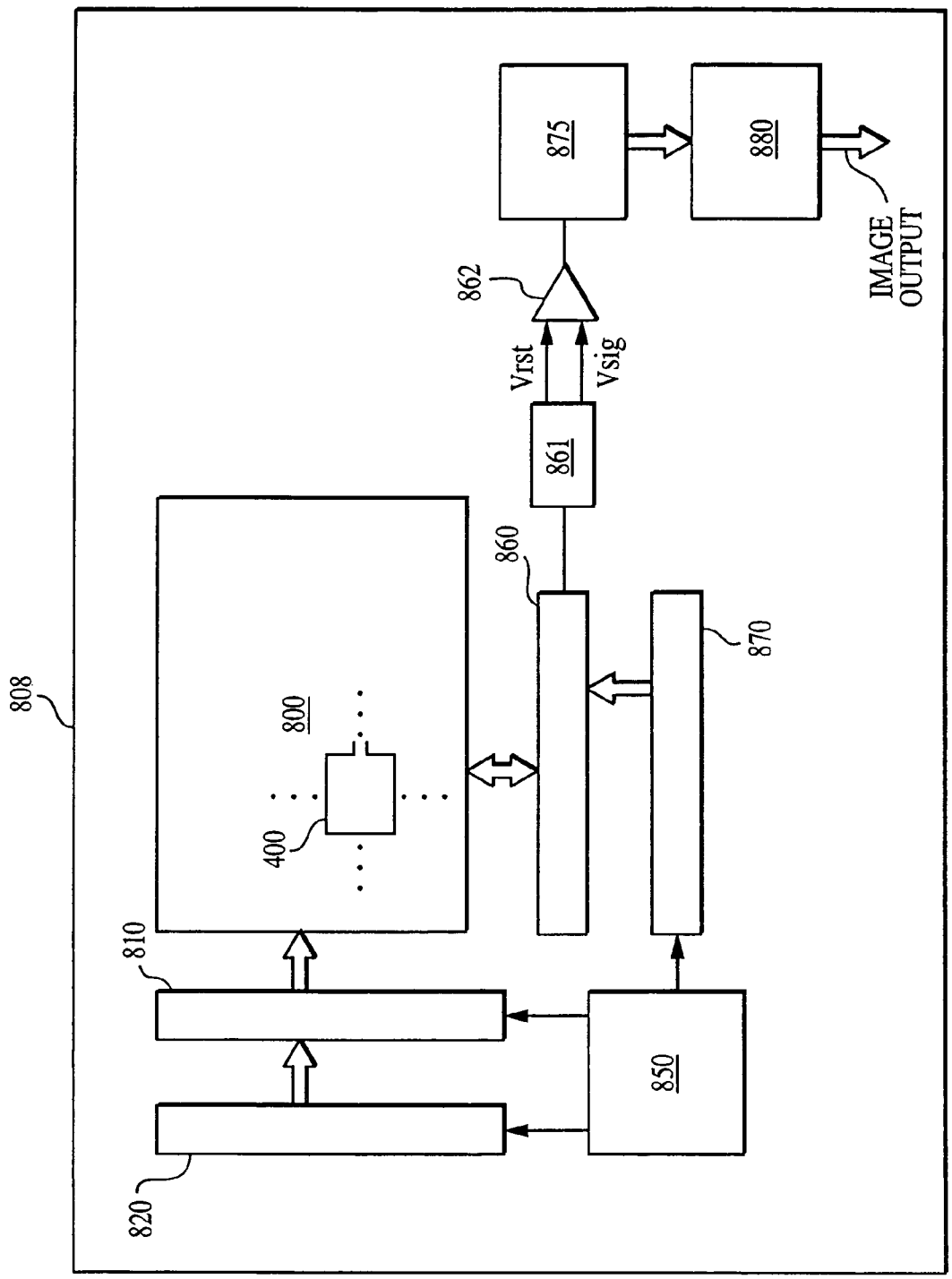
FIG. 19 illustrates a block diagram of a CMOS imager device having a pixel array, wherein the imager device may be combined with a processor in a single integrated circuit fabricated according to the present invention.

FIG. 19 illustrates a block diagram of a CMOS imager device IC 808 having a pixel array 800 containing a plurality of pixels arranged in rows and columns. Each pixel cell can include pixel cell 400 illustrated in FIG. 18. The pixels of each row in array 800 are all turned on at the same time by a row select line, and the pixels of each column are selectively output by respective column select lines. The row lines are selectively activated by a row driver 810 in response to row address decoder 820. The column select lines are selectively activated by a column selector 860 in response to column address decoder 870. The pixel array is operated by the timing and control circuit 850, which controls address decoders 820, 870 for selecting the appropriate row and column lines for pixel signal readout. The pixel column signals, which typically include a pixel reset signal ($V_{rst}$) and a pixel image signal ($V_{sig}$), are read by a sample and hold circuit 881 associated with the column selector 860. A differential signal ($V_{rst}$–$V_{sig}$) is produced by differential amplifier 862 for each pixel which is amplified and digitized by analog to digital converter 875 (ADC). The analog to digital converter 875 supplies the digitized pixel signals to an image processor 880 which forms a digital image.

Figure 20:
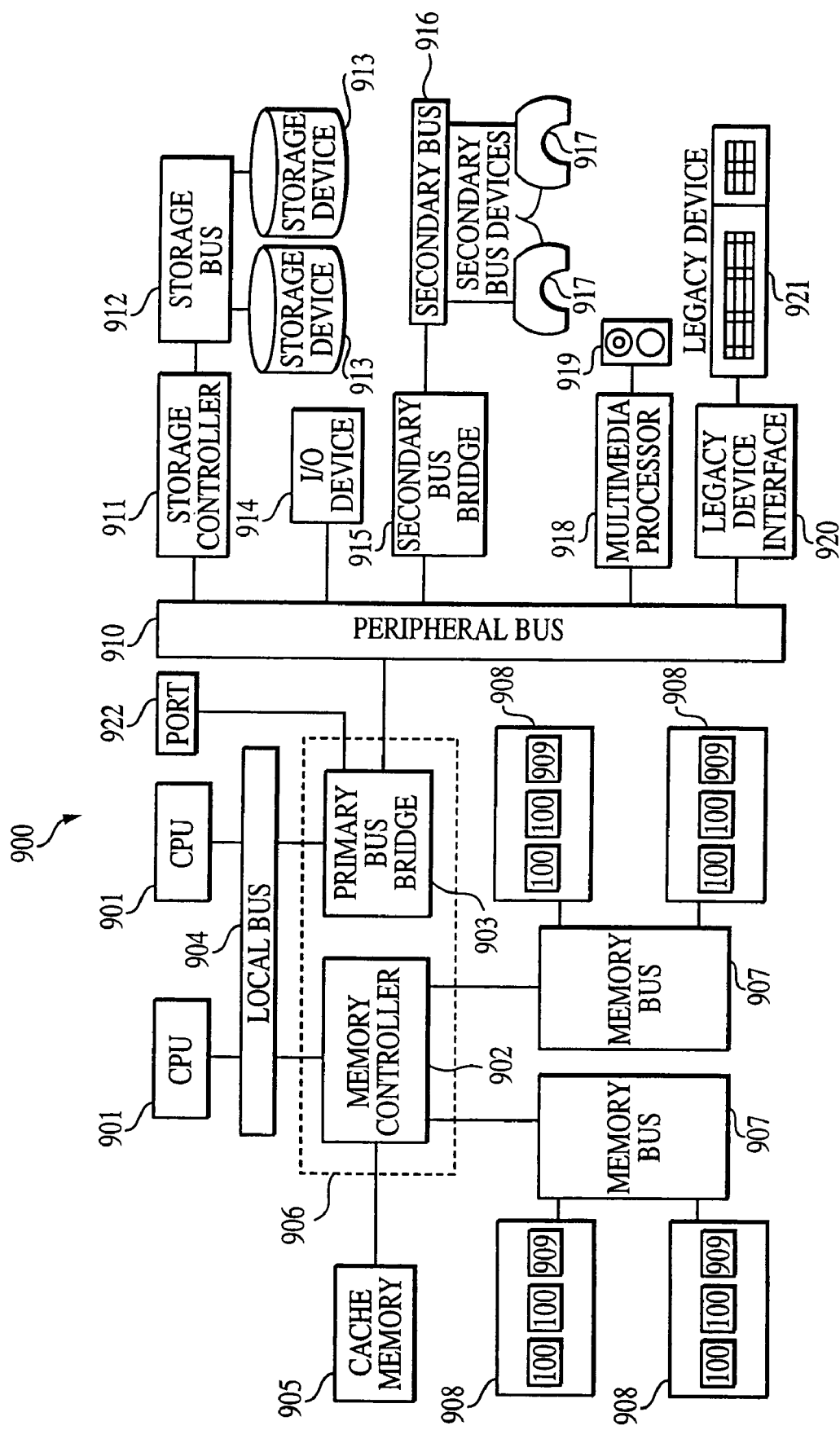
FIG. 20 illustrates a schematic diagram of a computer processor system which may utilize an imaging device, for example, a CMOS imaging device constructed in accordance with one embodiment of the invention.

If desired, the imaging device 808 described above with respect to FIG. 19 may be combined with a processor in a single integrated circuit. FIG. 20 illustrates an exemplary processing system 900 which may utilize an imaging device, for example, a CMOS imager 808 incorporating elements constructed in accordance with embodiments of the invention illustrated in FIGS. 2-17. Any one of the electronic components shown in FIG. 20, including CPU 901, may be fabricated as an integrated circuit for use in processing images formed in accordance with the imager and methods of the present invention.

As illustrated in FIG. 20, the processing system 900 includes one or more processors 901 coupled to a local bus 904. A memory controller 902 and a primary bus bridge 903 are also coupled the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus accepts memory components 908 which include at least one memory device 100. The memory components 908 may be a memory card or a memory module. Examples of memory modules include single inline memory modules (SIMMs) and dual inline memory modules (DIMMs). The memory components 908 may include one or more additional devices 909. For example, in a SIMM or DIMM, the additional device 909 might be a configuration memory, such as a serial presence detect (SPD) memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 includes peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may-be coupled to the peripheral bus 910. These devices may include a storage controller 911, an miscellaneous I/O device 914, a secondary bus bridge 915, a multimedia processor 918, and an legacy device interface 920. The primary bus bridge 903 may also be coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be an local area network interface, such as an Ethernet card. The secondary bus bridge may be used to interface additional devices via another bus to the processing system. For example, the secondary bus bridge may be an universal serial port (USB) controller used to couple USB devices 917 via to the processing system 900. The multimedia processor 918 may be a sound card, a video capture card, or any other type of media interface, which may also be coupled to one additional devices such as speakers 919. The legacy device interface 920 is used to couple legacy devices, for example, older styled keyboards and mice, to the processing system 900.

The processing system 900 illustrated in FIG. 20 is only an exemplary processing system with which the invention may be used. While FIG. 20 illustrates a processing architecture especially suitable for a general purpose computer, such as a workstation, it should be recognized that well known modifications can be made to configure the processing system 900 to become more suitable for use in a variety of applications. For example, many electronic devices which require processing may be implemented using a simpler architecture which relies on a CPU 901 coupled to memory components 908 and/or memory devices 100. These electronic devices may include, but are not limited to audio/video processors and recorders, and digital cameras and/or recorders. The CMOS imager IC 808, when coupled to a pixel processor, for example, may be implemented in digital cameras and video processors and recorders. Modifications may include, for example, elimination of unnecessary components, addition of specialized devices or circuits, and/or integration of a plurality of devices.

While the invention is preferably directed to methods for forming imager devices with distinct pixel capacitors and periphery capacitors, and structures incorporating such pixel capacitors and periphery capacitors, one skilled in the art will recognize that the invention can be used to form any type of imager device for integration with one or more processing components in a semiconductor device. For example, although the invention is described above for use in a CMOS image sensor, the invention is not limited to such and may be used in any suitable image sensor, for example, CCD image sensors.

The last (output) stage of a CCD image sensor provides sequential pixel signals as output signals, and uses a floating diffusion node, source follower transistor, and reset gate in a similar manner to the way these elements are used in the pixel of a CMOS imager. Accordingly, the pixels formed as described above may be employed in CCD image sensors as well as CMOS image sensors. The imager devices of the present invention may also be formed as different size megapixel imagers, for example imagers having arrays in the range of about 0.1 megapixels to about 20 megapixels.

Although the exemplary embodiments of the present invention have been described for only one NMOS transistor 100 (FIGS. 2-17) formed in the array area, and for only one PMOS transistor 200 (FIGS. 2-17) formed in the periphery area, it must be understood that the present invention contemplates the formation of a plurality of such MOSFET devices in their respective area. In addition, although the present invention has been described above with reference to the formation of one NMOS transistor 100 (FIGS. 2-17) in the array area, and one PMOS transistor 200 (FIGS. 2-17) in the periphery area, the invention also contemplates the formation of PMOS transistors in the array area and NMOS transistors in the periphery area. Similarly, the scope of the invention includes forming capacitors in both an array and its periphery.

Although the invention has been described above in connection with a four-transistor (4T) pixel cell employing a transfer transistor having a transfer gate, the invention may also be incorporated into a three-transistor (3T) cell, a five-transistor (5T) cell, a six-transistor (6T) cell or a seven-transistor (7T) cell, among others. As known in the art, a 3T cell differs from the 4T cell by the omission of the charge transfer transistor and associated gate, and the coupling of the n regions of the photodiode and the floating diffusion regions through an overlap of the two or an n region bridging the two, which is well known in the art. A 5T cell differs from the 4T cell by the addition of a shutter transistor or a CMOS photogate transistor.

Further, although the invention has been described above with reference to the formation of transistors and capacitors as part of a CMOS imager, the invention has equal applicability to the formation of transistors and capacitors as part of a CCD imager, a global shutter transistor, a high dynamic range transistor or a storage gate, among others.

The above description illustrates preferred embodiments that achieve the features and advantages of the present invention. It is not intended that the present invention be limited to the illustrated embodiments. Modifications and substitutions to specific process conditions and structures can be made without departing from the spirit and scope of the present invention. Accordingly, the invention is not to be considered as being limited by the foregoing description and drawings, but is only limited by the scope of the appended claims.

The invention claimed is:

1. A method of forming a semiconductor structure, comprising the steps of:
   providing a conductive layer over a semiconductor substrate;
   providing a dielectric layer over said conductive layer;
   forming at least one capacitor electrode over said dielectric layer and said conductive layer;
   subsequently forming a silicide layer over at least said conductive layer, and forming an insulating layer over said silicide layer;
   subsequently patterning said silicide layer and said insulating layer to form exposed regions of said conductive layer; and
   subsequently removing said exposed regions of said conductive layer.

2. The method of claim 1, wherein said silicide layer is formed over said conductive layer and said capacitor electrode.

3. The method of claim 1, wherein said step of forming at least one capacitor electrode comprises forming a polysilicon layer over said dielectric layer.

4. The method of claim 3, wherein said polysilicon layer is formed by deposition at a temperature between about 600° C. to about 800° C.

5. The method of claim 1, wherein said step of forming a silicide layer includes providing a metal layer over at least said conductive layer and annealing said metal layer to form said silicide layer.

6. The method of claim 5, wherein said metal layer is formed of a material selected from the group consisting of tungsten, titanium, cobalt, tantalum, molybdenum and platinum.

7. The method of claim 1, wherein said semiconductor structure is a gate of an MOS transistor.

8. A method of forming an imaging device having at least a gate structure with decreased impurity migration, comprising the steps of:
  forming at least one photosensor in a substrate;
  forming an oxide layer over said substrate;
  forming a first conductive layer over said oxide layer;
  providing a dielectric layer over said first conductive layer, and providing a second conductive layer over said dielectric layer, and subsequently patterning said second conductive layer and said dielectric layer to form a capacitor structure over said first conductive layer;
  subsequently providing a silicide layer over said first conductive layer and said capacitor structure, and providing an insulating layer over said silicide layer;
  patterning said insulating layer and said silicide layer with a first photoresist to obtain exposed regions of said first conductive layer adjacent patterned structures;
  providing a second photoresist over said exposed regions of said first conductive layer and over said patterned structures; and
  subsequently removing said exposed regions of said first conductive layer and portions of said gate oxide layer to form said gate structure.

9. The method of claim 8, wherein said imaging device is one of a 3T, 4T, 5T, 6T or 7T imaging device.

10. The method of claim 8, wherein said imaging device is a CMOS imager.

11. The method of claim 8, wherein said imaging device is a CCD imager.

12. The method of claim 8, wherein said first conductive layer is formed of doped polysilicon.

13. The method of claim 8, wherein said second conductive layer is formed of a material selected from the group consisting of a polysilicon, polysilicon/WSi and polysilicon/WN/W.

14. The method of claim 8, wherein said second conductive layer is formed of polysilicon.

15. The method of claim 14, wherein said second conductive layer is formed by deposition at a temperature between about 600° C. to about 800° C.

16. The method of claim 8, wherein said step of providing said silicide layer includes providing a metal layer and annealing said metal layer to form said silicide layer.

17. The method of claim 8, wherein said dielectric layer is formed of a material selected from the group consisting of an oxide, nitride, $Al_2O_3$, $Ta_2O_5$, and BST.

* * * * *